United States Patent
Toprac et al.

(10) Patent No.: US 6,699,727 B1
(45) Date of Patent: Mar. 2, 2004

(54) METHOD FOR PRIORITIZING PRODUCTION LOTS BASED ON GRADE ESTIMATES AND OUTPUT REQUIREMENTS

(75) Inventors: Anthony J. Toprac; Joyce S. Oey Hewett; Christopher A. Bode; Alexander J. Pasadyn; Anastasia Oshelski Peterson; Thomas J. Sonderman, all of Austin; Michael L. Miller, Cedar Park, all of TX (US)

(73) Assignee: Advanced Micro Devices Inc., Austin, TX (US)

( * ) Notice: Subject to any disclaimer, the term of this patent is extended or adjusted under 35 U.S.C. 154(b) by 280 days.

(21) Appl. No.: 09/821,675

(22) Filed: Mar. 29, 2001

(51) Int. Cl.⁷ .......................... G01R 31/26; H01L 21/66
(52) U.S. Cl. ............................ 438/17; 716/4
(58) Field of Search ................ 438/12, 5–11, 438/13, 17, 14–18, 800; 716/4–18

(56) References Cited

U.S. PATENT DOCUMENTS 6,049,742 A * 4/2000 Milne et al. ................ 700/90

* cited by examiner

Primary Examiner—Craig Thompson
(74) Attorney, Agent, or Firm—Williams, Morgan & Amerson, P.C.

(57) ABSTRACT

A method for prioritizing production flow includes processing a plurality of manufactured items in a process flow; measuring characteristics of a plurality of manufactured items in the process flow; estimating performance grades for the plurality of manufactured items based on the measured characteristics; grouping the manufactured items with like estimated performance grades; assigning priorities to groups of manufactured items with like estimated performance grades; and directing the plurality of manufactured items through the process flow based on the assigned priorities. A manufacturing system includes a plurality of processing tools adapted to process a plurality of manufactured items in a process flow, a metrology tool, and a process control server. The metrology tool is adapted to measure characteristics of a plurality of manufactured items in the process flow. The process control server is adapted to estimate performance grades for the plurality of manufactured items based on the measured characteristics, group the manufactured items with like estimated performance grades, assign priorities to groups of manufactured items with like estimated performance grades, and direct the plurality of manufactured items through the process flow based on the assigned priorities.

26 Claims, 3 Drawing Sheets

METHOD FOR PRIORITIZING PRODUCTION LOTS BASED ON GRADE ESTIMATES AND OUTPUT REQUIREMENTS

BACKGROUND OF THE INVENTION

1. Field of the Invention

This invention relates generally to semiconductor device manufacturing and, more particularly, to a method and apparatus for prioritizing production lots based on grade estimates and output requirements.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a wafer using a variety of processing tools, including photolithography steppers, etch tools, deposition tools, polishing tools, rapid thermal processing tools, implantation tools, etc. During the fabrication process various events may take place that affect the performance of the devices being fabricated. That is, variations in the fabrication process steps result in device performance variations. Factors, such as feature critical dimensions, doping levels, contact resistance, particle contamination, etc., all may potentially affect the end performance of the device.

In a typical semiconductor fabrication facility, wafers are processed in groups, referred to as lots. The wafers in a particular lot generally experience the same processing environment. In some tools, all of the wafers in a lot are processed simultaneously, while in other tools the wafers are processed individually, but under similar conditions (e.g., using the same operating recipe). Typically, a lot of wafers is assigned a priority in the beginning of its processing cycle. Priority may be assigned on the basis of the number of wafers in the lot or its status as a test or experimental lot, for example.

At a particular processing step, the relative assigned priorities of all the lots ready for processing are compared. Various rules are applied to determine which of the eligible lots is selected for processing. For example, for two lots with the same priority, the older of the lots is often selected for subsequent processing. In the case of a test lot of wafers (i.e., generally including a reduced number of wafers), the lot is subjected to one or more experimental processing steps or recipe adjustments in an attempt to improve the performance of the process or the performance of the resultant devices. Before commencing production of regular production lots using the experimental parameters, it is useful to first test the effectiveness of the changes based on the resulting characteristics of the wafers in the test lot. Hence, a test lot would be assigned a relatively high priority over other production lots, such that its processing is completed more quickly. Regardless of the particular priority assignments made, the rules are essentially static and predetermined. The priority of a particular lot does not typically change during its processing cycle, unless its status changes from being a production lot to a test lot, for example.

After fabrication of the devices is complete, each device is subjected to numerous functional tests to determine performance characteristics such as its maximum operating speed. Based on the results of the performance tests each device is assigned a grade, which effectively determines its market value. In general, the higher a device is graded, the more valuable the device. However, some applications do not require high-end devices. Accordingly, maximizing the output of the fabrication facility may correspond to maximizing the profitability of the facility.

Because of the variation in performance of the end product devices, it is difficult to predict the throughput of the processing line for devices of a particular grade. Hence, the supply of completed devices may not match the current output demands for the fabrication facility. For example, if a large number of high performing devices (i.e., more expensive devices) have been produced, but the current demand is for lower cost devices (i.e., slower), orders may not be able to be filled with the desired grade device. As a result, the manufacturer may be forced to sell devices of a higher grade at a lower price to fill the order. If the demand is for higher grade devices, and the supply of higher grade devices is diminished, the manufacturer may be unable to fill the order at all. Either situation results in lost profits for the manufacturer.

The present invention is directed to overcoming, or at least reducing the effects of, one or more of the problems set forth above.

SUMMARY OF THE INVENTION

One aspect of the present invention is seen in a method for prioritizing production flow. The method includes processing a plurality of manufactured items in a process flow; measuring characteristics of a plurality of manufactured items in the process flow; estimating performance grades for the plurality of manufactured items based on the measured characteristics; grouping the manufactured items with like estimated performance grades; assigning priorities to groups of manufactured items with like estimated performance grades; and directing the plurality of manufactured items through the process flow based on the assigned priorities.

Another aspect of the present invention is seen in a manufacturing system including a plurality of processing tools adapted to process a plurality of manufactured items in a process flow, a metrology tool, and a process control server. The metrology tool is adapted to measure characteristics of a plurality of manufactured items in the process flow. The process control server is adapted to estimate performance grades for the plurality of manufactured items based on the measured characteristics, group the manufactured items with like estimated performance grades, assign priorities to groups of manufactured items with like estimated performance grades, and direct the plurality of manufactured items through the process flow based on the assigned priorities.

BRIEF DESCRIPTION OF THE DRAWINGS

The invention may be understood by reference to the following description taken in conjunction with the accompanying drawings, in which like reference numerals identify like elements, and in which.

Figure 1:
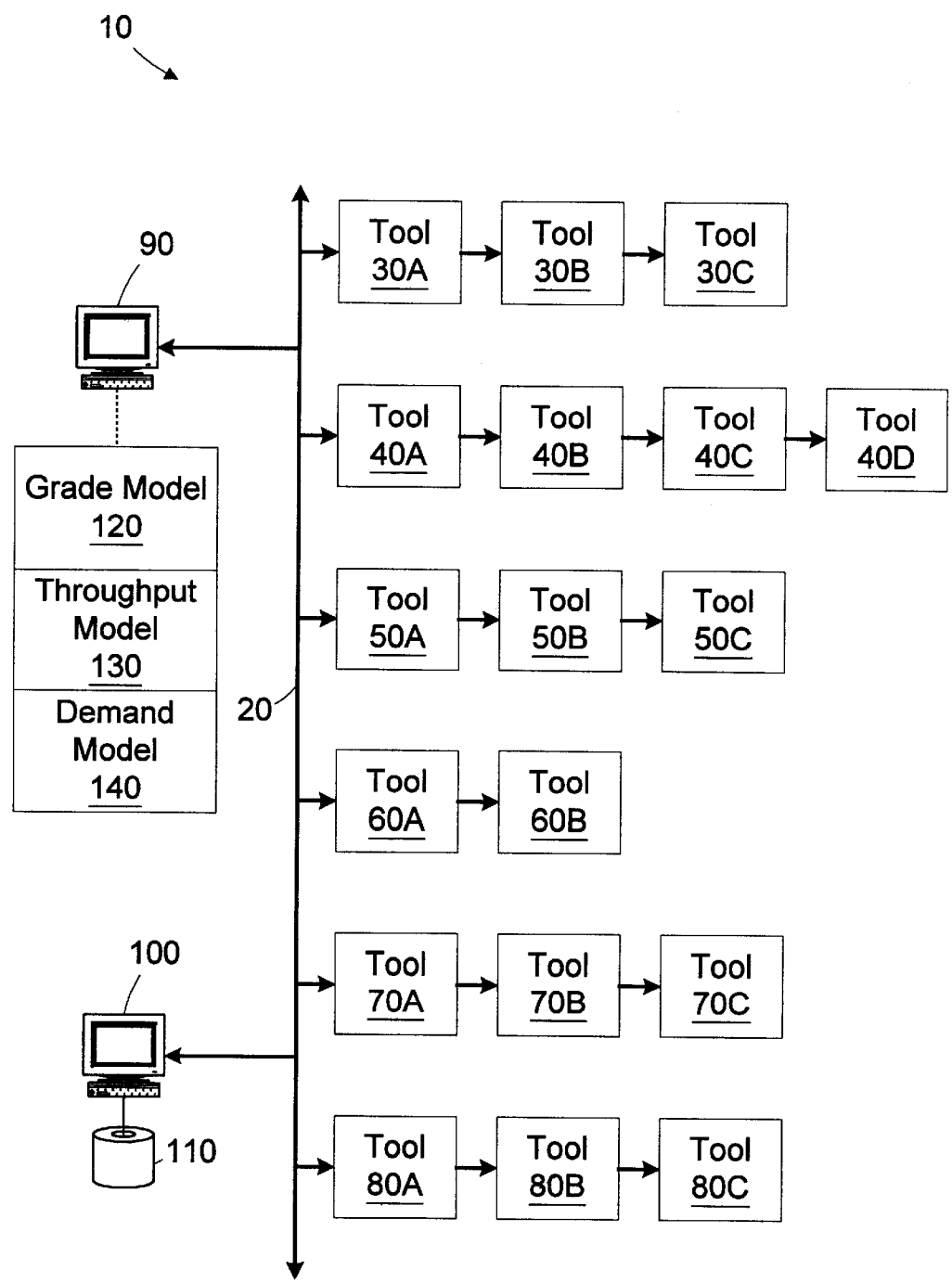
FIG. 1 is a simplified block diagram of a manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraint, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a simplified block diagram of an illustrative manufacturing system 10 is provided. In the illustrated embodiment, the manufacturing system 10 is adapted to fabricate semiconductor devices. Although the invention is described as it may be implemented in a semiconductor fabrication facility, the invention is not so limited and may be applied to other manufacturing environments. The techniques described herein may be applied to a variety of manufactured items including, but not limited to microprocessors, memory devices, digital signal processors, application specific integrated circuits (ASICs), or other similar devices. The techniques may also be applied to manufactured items other than semiconductor devices for which grade estimates may be generated during the fabrication of such items.

A network 20 interconnects various components of the manufacturing system 10, allowing them to exchange information. The illustrative manufacturing system 10 includes a plurality of tools 30–80. Each of the tools 30–80 may be coupled to a computer (not shown) for interfacing with the network 20. The tools 30–80 are grouped into sets of like tools, as denoted by lettered suffixes. For example, the set of tools 30A–30C represent tools of a certain type, such as a photolithography stepper. A particular wafer or lot of wafers progresses through the tools 30–80 as it is being manufactured, with each tool 30–80 performing a specific function in the process flow. Exemplary processing tools for a semiconductor device fabrication environment, include metrology tools, photolithography steppers, etch tools, deposition tools, polishing tools, rapid thermal processing tools, implantation tools, etc. The tools 30–80 are illustrated in a rank and file grouping for illustrative purposes only. In an actual implementation, the tools may be arranged in any order of grouping. Additionally, the connections between the tools in a particular grouping are meant to represent only connections to the network 20, rather than interconnections between the tools.

A process control server 90 directs the high level operation of the manufacturing system 10. The process control server 90 monitors the status of the various entities in the manufacturing system 10 and controls the flow of articles of manufacture (e.g., lots of semiconductor wafers) through the process flow. A database server 100 is provided for storing data related to the status of the various entities and articles of manufacture in the process flow. The database server 100 may store information in one or more data stores 110. The data may include pre-process and post-process metrology data, tool states, lot priorities, etc. The distribution of the processing and data storage functions amongst the different computers is generally conducted to provide independence and a central information store. Of course, a different number of computers may be used.

An exemplary information exchange and process control framework suitable for use in the manufacturing system 10 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The process control server 90 stores information related to the estimated performance grade and yield of the lots under production and determines relative priorities for the lots based thereon. The priorities may also be based on the output requirements of the manufacturing system 10. For example, if devices of a particular grade are in higher demand than those of another grade, lots with estimated grades matching the grade in demand are assigned a higher priority than other grades. The process control server 90 then routes the individual lots through the manufacturing system 10 based on their assigned priorities.

Various metrology information is collected during the fabrication of the lots. For example, physical measurements, such as transistor gate critical dimensions, particle contamination, process layer thickness, etc. may all be correlated to a particular estimate of the performance grade and yield. Direct performance metrology measurements, such as wafer electrical tests (e.g., drive current, effective channel length, dielectric constant) may also provide information related to performance grade and yield.

The particular metrology information used to estimate grade as well as the nature of the graded variable may vary depending on the particular manufactured item being produced and the market for such items. For example, memory devices may be graded differently than microprocessors.

The estimated grade and yield for a particular lot may change during its processing cycle. For example, deposition tools typically experience an increase in byproduct buildup between cleaning cycles. Hence, wafers processed immediately after the cleaning cycle is performed will have less particle contamination than wafers processed just prior to the performance of the cleaning cycle. If a particular lot passes through a deposition tool near the end of the time period between cleaning cycles, the particle contamination in the deposited process layer may be relatively high. This particle contamination may reduce the insulating properties of the process layer, resulting in a reduction in the anticipated grade of the devices in the lot. The increased particle contamination may also result in a lower anticipated yield for the lot. On the other hand, if the lot of wafers is processed in a deposition tool just after the cleaning cycle is performed, its estimated grade and yield may increase. Similar effects on estimated grade and yield may result from the effects of processing in other tools.

Preprocess and post-process metrology information collected as a particular lot passes through the manufacturing system 10 may be used by the process control server 90 to dynamically update the estimated grade and yield of the lot. At various steps in the process flow, the post-process metrology information may be correlated to estimated grade and yield based on an empirical grade model 120. The particular points in the process flow where anticipated grade and yield are updated depend on the particular implementation. Exemplary grade and yield adjustment points include after the gate electrode has been formed (i.e., based on gate electrode physical dimensions), after formation of the first metal layer (i.e., based on drive current or effective channel length), after formation of the inter-level dielectric layer (i.e., based on measured dielectric constant), after formation of active source/drain regions (i.e., based on dimensions), after implant and thermal annealing (i.e., based on measured bulk resistivity, transistor threshold voltage, drive current, implant does and energy, implant anneal time and temperature), etc. The grade model 120 may actually include a plurality of individual models for estimating grade and yield based on information collected at the various estimation points.

Many different measurements, both physical and electrical, may be used for determining grade and yield estimates. An exemplary, but not exhaustive, list of physical measurements includes a transistor gate critical dimension, a process layer thickness, a particle contamination count, and a transistor active region dimension. An exemplary, but not exhaustive, list of electrical measurements includes a transistor effective channel length, a drive current, an insulating layer dielectric constant, a transistor overlap capacitance, a regional material resistivity, a transistor threshold voltage, an n-channel to p-channel drive current ratio, an off-state transistor leakage current, and electrical charge carrier mobility measurement, and an oscillator test circuit frequency. Also, process parameters may also be used for estimating grade and yield. An exemplary, but not exhaustive, list of process parameters includes implant dose and energy, and anneal temperature and time.

Periodically, the process control server 90 determines the estimated production rate for each grade classification based on a throughput model 130 and compares the estimated rate to the actual or projected demand for devices of the associated grades as determined by a demand model 140. The projected demand generated by the demand model 140 may be based on actual customer orders, or based on a demand forecasting model, such as are widely available using commercial software. The determination of the estimated production rate by the throughput model 130 includes consideration of the anticipated time to completion of devices within the process flow. For selected points in the process flow, the average time to completion is determined as a function of priority. Higher priority lots have a lower average time to completion than lower priority lots. The average time to completion values may be adjusted periodically (i.e., once per shift, once per day, once per week, etc.). Based on knowledge of the estimated grade and yield, the assigned priorities, and the associated time to completion, the throughput model 130 employed by the process control server 90 estimates the throughput of the manufacturing system 10 for each of the grades.

The determination of demand by the demand model 140 may include consideration of the current inventory levels of the particular grades. Customer orders for each grade may be analyzed in view of current inventory levels, such that devices of a particular grade that are high in demand, but have a relatively large inventory level, are not prioritized higher than a particular grade having a relatively lower demand, but less inventory. For example, the process control server 90 may estimate the throughput of the manufacturing system to project an inventory level over time (i.e., including the exiting inventory). Assuming the demand is higher than the production rate, the projected inventory level might reach zero at a particular time, referred to as a zero point. Grades with estimated demand levels less than the projected throughput will necessarily have no zero-point, as the inventory will never be depleted. The process control server 90 may compare the zero-points of all the grades to determine those requiring an increased priority relative to one another. Such an approach factors in existing inventory as well as anticipated future inventory. A zero-point analysis may also identify that overall throughput of the manufacturing system 10 needs to be increased. If a significant number of grades have associated zero-points that are closely approaching it may indicate that the current production rate of the entire manufacturing system 10 is too low. In order to meet customer demand across all grade levels, the net throughput of the manufacturing system 10 may need to be increased.

Priorities for grades with matching production rate and demand values may be set at an average level. Priorities for grades having a projected surplus may be assigned a relatively lower priority, and grades having a projected shortfall may be assigned a relatively higher priority. The process control server 90 may reset all of the assigned priorities at every iteration, or alternatively, the process control server 90 may incrementally increase or decrease the assigned priorities as appropriate. The particular control choice and frequency of the priority adjustments are implementation specific.

Figure 2:
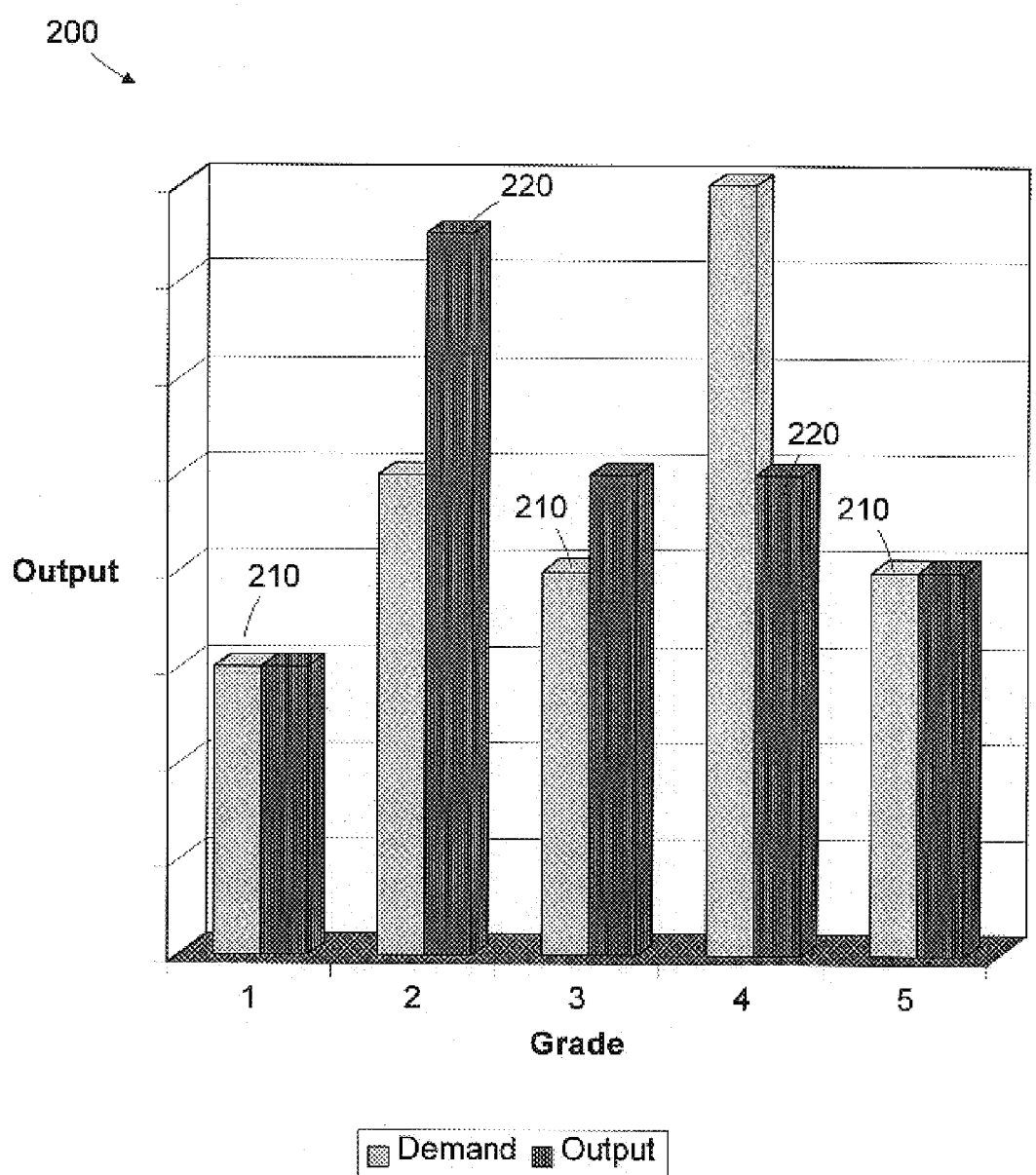
FIG. 2 is a graph showing output requirements and fabrication rate for the manufacturing system of FIG. 1.

Turning now to FIG. 2, a graph 200 illustrating output requirements and estimated production rates is shown. The graph 200 illustrates projected demand values 210 and projected output values 220 for each device grade. For clarity and ease of illustration, the illustration of FIG. 2 does not directly account for current inventory levels. However, consideration of the current inventory levels may be factored into either projected output or projected demand. In the illustrated example, five different grades are provided, although any number of grade designations may be made. The grades may represent anticipated clock rates for microprocessors, for example. Grade 1 represents the fastest group of microprocessors, while grade 5 represents the slowest group of microprocessors. Of course, the nature of the performance characteristic on which the grade is based will vary on the specific manufactured item being considered.

Note that the projected demand for grades 1 and 5 essentially matches the projected output. The priorities of lots being produced with an estimated performance corresponding to grades 1 and 5 may be left unchanged by the process control server 90. For grade 4, the estimated demand is significantly higher than the estimated output. The demand for grade 4 devices may be higher, because a large number of consumers are purchasing lower-end computers during the Christmas shopping season, for example. Traditional process control tends to optimize the operation of the manufacturing system 10 for high grade devices. Such an approach in this case would result in a shortfall for the devices actually demanded by the market and result in lost profits (i.e., due to filling grade 4 orders with higher grade devices or leaving grade 4 orders unfilled). The process control server 90 increases the priorities of lots associated with grade 4 to increase the output of the manufacturing system 10 for grade 4 devices.

The estimated demands for grades 2 and 3 are less than the estimated output, with grade 2 having a higher mismatch. The process control server 90 thus reduces the priorities of grades 2 and 3 relative to the other grades. Lots associated with grade 2 devices are assigned a priority lower than those associated with grade 3 devices.

The resulting priority rankings assigned by the process control server, in order of highest priority to lowest priority, are 4, 1, 5, 3, 2. The process control server 90 periodically repeats the analysis described above to account for changes in the demand and/or changes in the estimated grade and yield of particular lots in the process flow.

Figure 3:
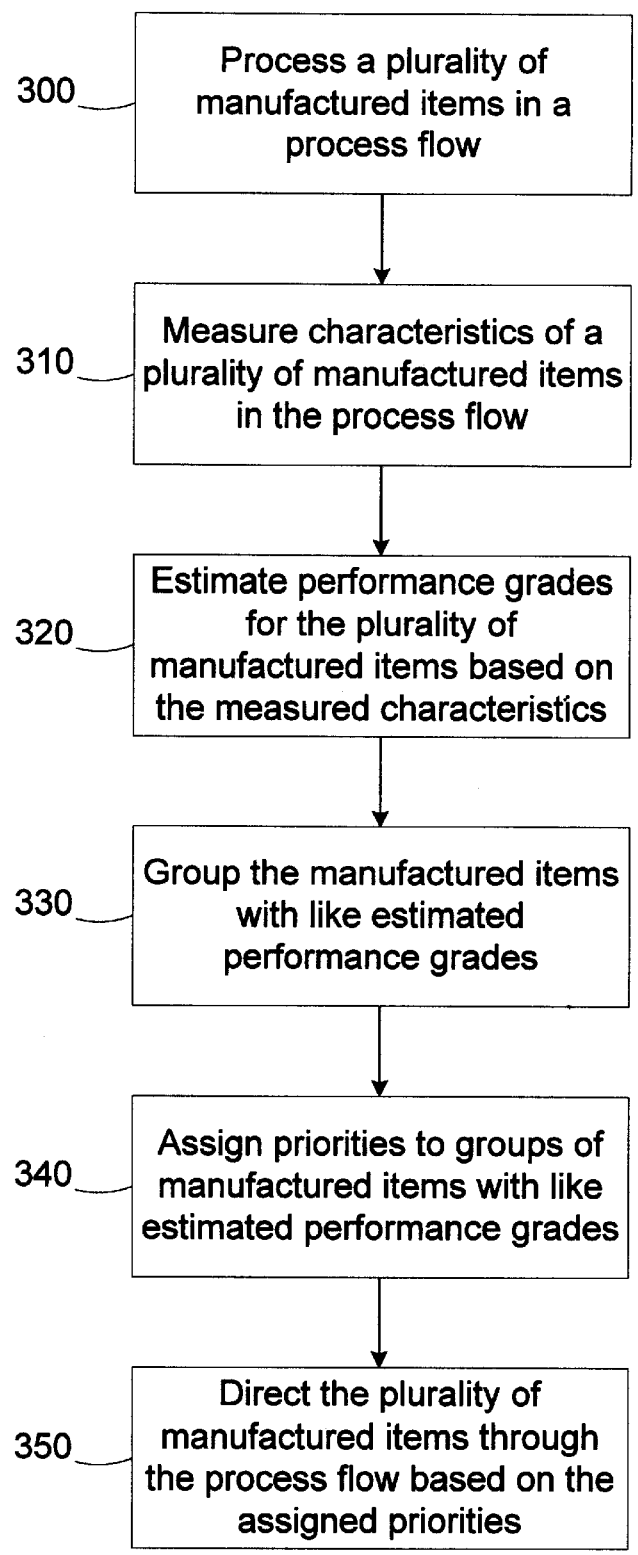
FIG. 3 is a simplified flow diagram of a method for prioritizing production lots based on grade estimates and output requirements in accordance with another embodiment of the present invention.

Turning now to FIG. 3, a simplified flow diagram of a method for prioritizing production lots based on grade estimates and output requirements in accordance with another embodiment of the present invention is provided. In block 300, a plurality of manufactured items are processed in a process flow. In block 310, characteristics of a plurality of manufactured items in the process flow are measured. These characteristics may include physical characteristics (e.g., transistor gate critical dimension, process layer thickness, particle contamination count, etc.) or electrical characteristics (e.g., transistor effective channel length, drive current, insulating layer dielectric constant, etc.). In block 320, performance grades for the plurality of manufactured items are estimated based on the measured characteristics. In some embodiments, the yield quantity may also be estimated. In block 330, the manufactured items with like estimated performance grades are grouped. In block 340, priorities are assigned to groups of manufactured items with like estimated performance grades. In block 350, the plurality of manufactured items are directed through the process flow based on the assigned priorities.

Estimating performance grade and yield, as described above, for the semiconductor devices being fabricated and prioritizing the flow of the devices through the manufacturing system 10 has numerous advantages. The priority of certain performance grades can be increased or decreased to account for changes in the demand for devices of that particular grade. Such a prioritization increase the efficiency of the manufacturing system 10 and helps ensure that customer orders may be filled with devices of the appropriate grade. Another advantage is that the performance grade and priorities may be assigned dynamically as the devices in the process flow undergo processes that might change their estimated performance.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for prioritizing production flow, comprising:
   processing a plurality of manufactured items in a process flow;
   measuring characteristics of a plurality of manufactured items in the process flow;
   estimating performance grades for the plurality of manufactured items based on the measured characteristics;
   grouping the manufactured items with like estimated performance grades;
   assigning priorities to groups of manufactured items with like estimated performance grades; and
   directing the plurality of manufactured items through the process flow based on the assigned priorities.

2. The method of claim 1, further comprising determining an estimated throughput for manufactured items in the process flow with a common estimated performance grade, wherein assigning the priorities comprises assigning the priorities for the manufactured items with the common estimated performance grade based on the estimated throughput.

3. The method of claim 2, further comprising estimating yields for the plurality of manufactured items based on the measured characteristics, and wherein determining the estimated throughput for the manufactured items comprises determining the estimated throughput based on the estimated yields.

4. The method of claim 2, wherein determining the estimated throughput for manufactured items comprises determining an average completion time for manufactured items in the process flow based on their assigned priorities.

5. The method of claim 4, wherein determining the estimated throughput for manufactured items comprises combining the estimated throughput with current inventory levels for manufactured items having a common estimated performance grade.

6. The method of claim 2, further comprising:

determining an estimated demand for manufactured items with the common estimated performance grade; and comparing the estimated demand to the estimated throughput, wherein assigning the priorities comprises assigning the priorities for the manufactured items with the common estimated performance grade based on the estimated demand and the estimated throughput.

7. The method of claim 1, wherein measuring the characteristics comprises measuring a physical characteristic of the manufactured items.

8. The method of claim 7, wherein the manufactured items comprise semiconductor devices, and measuring the physical characteristic comprises measuring at least one of a transistor gate critical dimension, a process layer thickness, a particle contamination count, and a transistor active region dimension.

9. The method of claim 1, wherein measuring the characteristics comprises measuring at least one of an implant dose and energy, and an anneal temperature and time.

10. The method of claim 1, wherein measuring the characteristics comprises measuring an electrical characteristic of the manufactured items.

11. The method of claim 10, wherein the manufactured items comprise semiconductor devices, and measuring the electrical characteristic comprises measuring at least one of a transistor effective channel length, a drive current, an insulating layer dielectric constant, a transistor overlap capacitance, a regional material resistivity, a transistor threshold voltage, an n-channel to p-channel drive current ratio, an off-state transistor leakage current, and electrical charge carrier mobility measurement, and an oscillator test circuit frequency.

12. The method of claim 1, further comprising periodically measuring the characteristics of the manufactured items and updating the associated performance grade and associated priorities as the manufactured items progress through the process flow.

13. The method of claim 1, wherein processing the plurality of manufactured items comprises processing at least one of a plurality of microprocessors, a plurality of memory devices, a plurality of digital signal processors, and a plurality of application specific integrated circuits.

14. A method for prioritizing production flow, comprising:

processing a plurality of semiconductor devices in a process flow;

measuring characteristics of a plurality of semiconductor devices in the process flow;

estimating speed grades for the plurality of semiconductor devices based on the measured characteristics;

grouping the semiconductor devices with like estimated speed grades;

assigning priorities to groups of semiconductor devices with like estimated speed grades; and directing the plurality of semiconductor devices through the process flow based on the assigned priorities.

15. The method of claim 14, further comprising determining an estimated throughput for semiconductor devices in the process flow with a common estimated speed grade, wherein assigning the priorities comprises assigning the priorities for the semiconductor devices with the common estimated speed grade based on the estimated throughput.

16. The method of claim 15, further comprising estimating yields for the plurality of semiconductor devices based on the measured characteristics, and wherein determining the estimated throughput for the semiconductor devices comprises determining the estimated throughput based on the estimated yields.

17. The method of claim 15, wherein determining the estimated throughput for semiconductor devices comprises determining an average completion time for semiconductor devices in the process flow based on their assigned priorities.

18. The method of claim 17, wherein determining the estimated throughput for semiconductor devices comprises combining the estimated throughput with current inventory levels for semiconductor devices having a common estimated speed grade.

19. The method of claim 15, further comprising:

determining an estimated demand for semiconductor devices with the common estimated speed grade; and comparing the estimated demand to the estimated throughput, wherein assigning the priorities comprises assigning the priorities for the semiconductor devices with the common estimated speed grade based on the estimated demand and the estimated throughput.

20. The method of claim 14, wherein measuring the characteristics comprises measuring a physical characteristic of the semiconductor devices.

21. The method of claim 20, wherein measuring the physical characteristic comprises measuring at least one of a transistor gate critical dimension, a process layer thickness, a particle contamination count, and a transistor active region dimension.

22. The method of claim 14, wherein measuring the characteristics comprises measuring at least one of an implant dose and energy, and an anneal temperature and time.

23. The method of claim 14, wherein measuring the characteristics comprises measuring an electrical characteristic of the semiconductor devices.

24. The method of claim 23, wherein measuring the electrical characteristic comprises measuring at least one of a transistor effective channel length, a drive current, an insulating layer dielectric constant, a transistor overlap capacitance, a regional material resistivity, a transistor threshold voltage, an n-channel to p-channel drive current ratio, an off-state transistor leakage current, and electrical charge carrier mobility measurement, and an oscillator test circuit frequency.

25. The method of claim 14, further comprising periodically measuring the characteristics of the semiconductor devices and updating the associated speed grade and associated priorities as the semiconductor devices progress through the process flow.

26. The method of claim 14, wherein processing the plurality of semiconductor devices comprises processing at least one of a plurality of microprocessors, a plurality of memory devices, a plurality of digital signal processors, and a plurality of application specific integrated circuits.

\* \* \* \* \*